(12) United States Patent
Otsubo et al.

(10) Patent No.: US 10,506,717 B2
(45) Date of Patent: Dec. 10, 2019

(54) INDUCTOR COMPONENT AND METHOD OF MANUFACTURING INDUCTOR COMPONENT

(71) Applicant: Murata Manufacturing Co., Ltd., Kyoto (JP)

(72) Inventors: Yoshihito Otsubo, Kyoto (JP); Shinichiro Banba, Kyoto (JP); Mitsuyoshi Nishide, Kyoto (JP); Norio Sakai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/046,225

(22) Filed: Jul. 26, 2018

(65) Prior Publication Data

US 2018/0332709 A1    Nov. 15, 2018

Related U.S. Application Data

(63) Continuation of application No. PCT/JP2016/078771, filed on Sep. 29, 2016.

(30) Foreign Application Priority Data

Jan. 27, 2016   (JP) .................................. 2016-013185

(51) Int. Cl.
*H05K 1/00* (2006.01)
*H05K 1/18* (2006.01)
(Continued)

(52) U.S. Cl.
CPC .......... *H05K 1/185* (2013.01); *H01F 17/0013* (2013.01); *H01F 17/0033* (2013.01);
(Continued)

(58) Field of Classification Search
CPC .......... H01F 27/29; H01F 17/04; H01F 27/24; H01F 27/28; H01F 41/04; H01F 17/0013;
(Continued)

(56) References Cited

U.S. PATENT DOCUMENTS

| 7,109,838 B2 * | 9/2006 | Brennan | ............. H01F 17/0033 257/E21.022 |
| 2003/0030985 A1 * | 2/2003 | Sakai | ................ H01L 23/49822 361/720 |

(Continued)

FOREIGN PATENT DOCUMENTS

| JP | S51-118950 U | 9/1976 |
| JP | H07-320969 A | 12/1995 |

(Continued)

OTHER PUBLICATIONS

International Search Report for International Application No. PCT/JP2016/078771, dated Dec. 27, 2016.
(Continued)

*Primary Examiner* — Pete T Lee
(74) *Attorney, Agent, or Firm* — Pearne & Gordon LLP

(57) ABSTRACT

An inductor component 1a includes a resin layer 3 and an inductor electrode 6. The inductor electrode 6 includes metal pins 7a to 7d that extend in the resin layer 3 with end faces 70a to 70d of the metal pins 7a to 7d exposed from an upper surface 3a of the resin layer 3, and upper wiring plates 8a and 8b that are disposed on the upper surface 3a of the resin layer 3 and that connect the end faces 70a and 70c of the short metal pins 7a and 7c and the end faces 70b and 70d of the long metal pins 7b and 7d to each other. In this case, the inductor electrode 6 is formed of the metal pins 7a to 7d and the wiring plates 8a to 8c that each have a specific electrical resistance lower than that of a conductive paste and plating.

12 Claims, 5 Drawing Sheets

(51) Int. Cl.
*H01F 17/04* (2006.01)
*H05K 3/46* (2006.01)
*H01F 27/24* (2006.01)
*H01F 27/29* (2006.01)
*H01F 27/32* (2006.01)
*H01F 41/02* (2006.01)
*H05K 1/11* (2006.01)
*H01F 17/00* (2006.01)
*H01F 27/28* (2006.01)
*H01F 41/04* (2006.01)
*H01F 27/02* (2006.01)

(52) U.S. Cl.
CPC .............. *H01F 17/04* (2013.01); *H01F 27/24* (2013.01); *H01F 27/2847* (2013.01); *H01F 27/29* (2013.01); *H01F 27/327* (2013.01); *H01F 41/02* (2013.01); *H01F 41/043* (2013.01); *H05K 1/115* (2013.01); *H05K 3/46* (2013.01); *H01F 27/022* (2013.01); *H01F 2017/002* (2013.01); *H05K 2201/1003* (2013.01); *H05K 2201/10378* (2013.01)

(58) Field of Classification Search
CPC .............. H01F 17/0033; H01F 27/2847; H01F 27/327; H01F 41/02; H01F 41/043; H01F 27/022; H01F 2017/002; H05K 1/185; H05K 3/30; H05K 2201/1003; H05K 2203/1305; H05K 1/115; H05K 3/46; H05K 2201/10378
See application file for complete search history.

(56) References Cited

U.S. PATENT DOCUMENTS

| | | | |
|---|---|---|---|
| 2007/0090912 A1* | 4/2007 | Lee | H01F 17/0013 336/200 |
| 2008/0297299 A1* | 12/2008 | Yun | H01F 17/0013 336/200 |
| 2012/0146757 A1* | 6/2012 | Tsai | H01F 17/0013 336/200 |
| 2012/0228755 A1* | 9/2012 | Nagano | H01L 23/04 257/698 |
| 2013/0232781 A1 | 9/2013 | Nakamura et al. | |
| 2014/0218147 A1 | 8/2014 | Chatani et al. | |

FOREIGN PATENT DOCUMENTS

| | | |
|---|---|---|
| JP | 2000-40620 A | 2/2000 |
| JP | 2002-289419 A | 10/2002 |
| JP | 2010-225699 A | 10/2010 |
| JP | 5474251 B1 | 4/2014 |
| JP | 2015-106574 A | 6/2015 |

OTHER PUBLICATIONS

Written Opinion for International Application No. PCT/JP2016/078771, dated Dec. 27, 2016.

* cited by examiner

FIG. 1
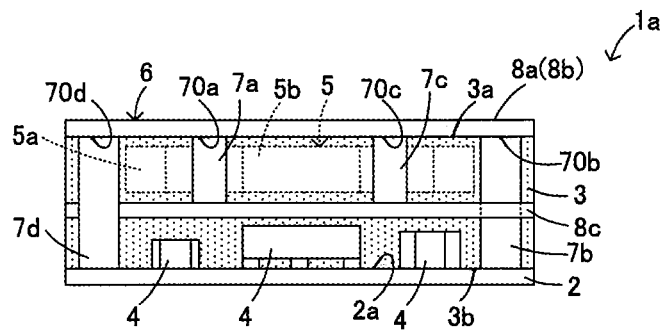
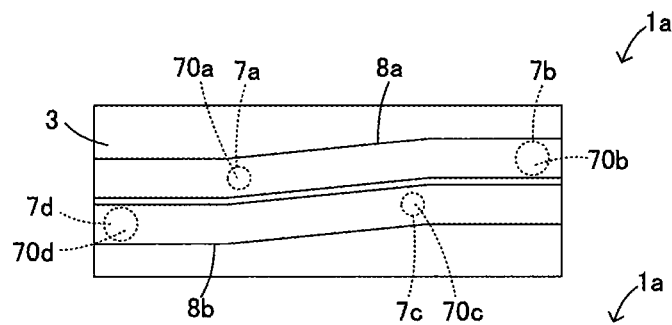
FIG. 2A
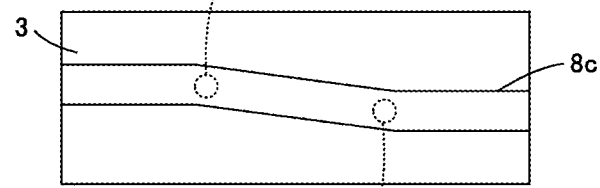
FIG. 2B
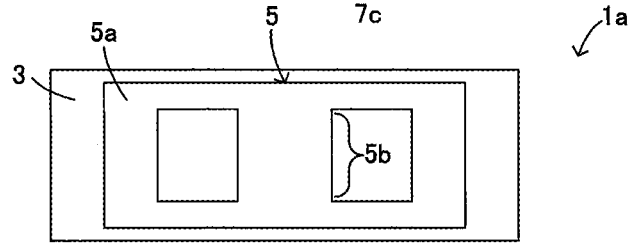
FIG. 2C
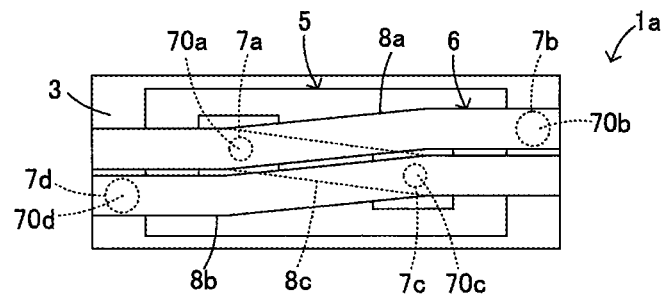
FIG. 2D

INDUCTOR COMPONENT AND METHOD OF MANUFACTURING INDUCTOR COMPONENT

This is a continuation of International Application No. PCT/JP2016/078771 filed on Sep. 29, 2016 which claims priority from Japanese Patent Application No. 2016-013185 filed on Jan. 27, 2016. The contents of these applications are incorporated herein by reference in their entireties.

BACKGROUND OF THE DISCLOSURE

Field of the Disclosure

The present disclosure relates to an inductor component that includes a resin layer and an inductor electrode and a method of manufacturing the inductor component.

Description of the Related Art

As illustrated in FIG. 6, an inductor component 100 that has been known as an existing inductor component includes a coil 102 that is disposed on a core substrate 101 that is formed of a printed circuit board or a prepreg (see, for example, Patent Document 1). In this case, an annular magnetic-material layer 103 is disposed in the core substrate 101, and the coil 102 is spirally wound around the magnetic-material layer 103. The coil 102 includes inner interlayer connection conductors 102a that are arranged along the inner circumference of the magnetic-material layer 103, outer interlayer connection conductors 102b that are paired with the inner interlayer connection conductors 102a and arranged along the outer circumference of the magnetic-material layer 103, upper wiring patterns 102c each of which connects the upper end of the corresponding inner interlayer connection conductor 102a to the upper end of the corresponding outer interlayer connection conductor 102b, and lower wiring patterns 102d each of which connects the lower end of the corresponding inner interlayer connection conductor to the lower end of the corresponding outer interlayer connection conductor 102b. Each of the interlayer connection conductors 102a and 102b is formed of a through-hole conductor that is obtained by forming a conductive film on an inner surface of a through-hole that extends through the core substrate 101. Each of the wiring patterns 102c and 102d is formed of a print pattern with a conductive paste.

Patent Document 1: Japanese Unexamined Patent Application Publication No. 2000-40620 (see, for example, a paragraph 0018 and FIG. 1)

BRIEF SUMMARY OF THE DISCLOSURE

In recent years, electronic devices have decreased size and increased high functionality, and there is a need to decrease the size of inductor components that are equipped with inductor electrodes. One of the methods for improving the characteristics of the inductor components is to decrease the resistance value of the inductor electrodes (the coil 102 for the inductor component 100). However, each of the interlayer connection conductors 102a and 102b of the existing inductor component 100 that form the coil 102 is formed of the through-hole conductor that is obtained by forming the conductive film on the inner surface of the through-hole, and there is a limitation on decrease in connection resistance between the upper wiring patterns 102c and the lower wiring patterns 102d. The connection resistance can be decreased in a manner in which the through-holes are filled with a conductive paste to form via conductors. However, the conductive paste is typically formed of a mixture of a metal filler and an organic solvent or another solvent and, in this case, has a specific electrical resistance higher than that of a pure metal. Similarly, the wiring patterns 102c and 102d are formed of a conductive paste, and it is difficult for the entire inductor electrodes to have a decreased resistance value.

The present disclosure has been accomplished in view of the above problems, and it is an object of the present disclosure to provide an inductor component that includes a resin layer and an inductor electrode having a decreased resistance value and that has an increased bond strength between a metal plate and metal pins.

To achieve the above object, an inductor component according to the present disclosure includes a resin layer, and an inductor electrode. The inductor electrode includes a first metal pin and a second metal pin that extend in the resin layer with one end face of the first metal pin and one end face of the second metal pin exposed from a main surface of the resin layer, and a first metal plate that is disposed on the main surface of the resin layer and that connects the one end face of the first metal pin and the one end face of the second metal pin to each other. The second metal pin is longer than the first metal pin. An area of the one end face of the second metal pin is larger than an area of the one end face of the first metal pin.

With this structure, the inductor electrode includes the first and second metal pins and the first metal plate that each have a specific electrical resistance lower than that of a conductive paste and plating, and accordingly, the resistance of the entire inductor electrode can be decreased. Consequently, the characteristics (for example, an inductance value) of the inductor component can be improved. In addition, there is no need for a process of forming a via hole and a plating process, and accordingly, the manufacturing cost of the inductor component can be decreased. The second metal pin, which is longer than the first metal pin, needs to have a bond strength higher than that of the first metal pin. According to the present disclosure, the area of the one end face of the second metal pin is increased, and this increases bond strength, particularly, between the second metal pin and the first metal plate. Taking advantage of the length of the second metal pin and the first metal pin enables the degree of freedom of a design of the inside of the resin layer to be increased, for example, such that a region of the resin layer on the main surface side is used as a region in which the inductor electrode is formed, and a region of the resin layer on the other main surface side is used as a region in which a component is disposed.

The thickness of the second metal pin may be more than the thickness of the first metal pin. With this structure, the bond strength between the long second metal pin and the metal plate can be increased. In addition, the metal components in the inductor component increase, and accordingly, the heat dissipation of the inductor component can be improved. Moreover, for example, in the case where the other end face of the second metal pin is used as an electrode for external connection, the strength of connection to an outer electrode can be increased.

An end portion of the second metal pin that has the one end face may have a flange shape. With this structure, the bond strength between the metal plate and the metal pin can be increased without narrowing the inner region of the inductor component.

The inductor component may further include a circuit board a main surface of which is in contact with the other main surface of the resin layer, and a component that is mounted on the main surface of the circuit board and that is sealed by the resin layer. The inductor electrode may further include a second metal plate that is formed in the resin layer and is connected to the other end face of the first metal pin. The other end face of the second metal pin may be exposed from the other main surface of the resin layer and may be connected to the circuit board.

With this structure, for example, in the case where an outer electrode is formed on a back surface of the circuit board opposite the main surface, and the inductor component is mounted on a motherboard, a component can be disposed near the motherboard, and accordingly, the heat dissipation when the component generates the heat can be improved. The arrangement of the component between the main surface of the circuit board and the second metal plate enables the size of the inductor component to be decreased.

The inductor electrode may further include a third metal pin that is shorter than the second metal pin and that extends in the resin layer with one end face of the third metal pin exposed from the main surface of the resin layer, and a third metal plate that is disposed on the main surface of the resin layer and that is connected to the one end face of the third metal pin. The second metal plate may connect the other end face of the first metal pin and the other end face of the third metal pin to each other such that the inductor electrode forms a coil that has a winding axis that is substantially parallel to the main surface of the resin layer.

With this structure, a three-dimensional coil extending in both directions of the main surface and the thickness of the resin layer can be formed. In addition, a component can be disposed between the main surface of the circuit board and the second metal plate, and the size of the inductor component can be readily decreased. Since the thicknesses of the first metal pin and the third metal pin that form a part of the coil are less than the thickness of the second metal pin, the number of the metal pins that are disposed on the part of the coil can be increased, and the winding number of the coil can be increased.

A part of an edge of the first metal plate, or a part of an edge of the second metal plate, or the parts of the edges of the first metal plate and the second metal plate may reach a periphery of the resin layer when viewed from a direction perpendicular to the main surface of the resin layer.

With this structure, a metallic portion of the inductor component increases, and the heat dissipation of the inductor component can be improved. Since the part of the edge of the second metal plate reaches the periphery of the resin layer, the part of the second metal plate is exposed from the resin layer, and accordingly, the heat that is retained in the resin layer is likely to be dissipated.

The inductor component may include a coil core that is disposed between the first metal pin and the third metal pin and between the first metal plate and the second metal plate. With this structure, the inductance value of the inductor electrode can be effectively increased.

The coil core may have a shape obtained from a combination of an annular portion and a rod-like portion that is disposed such that the rod-like portion halves an inner region of the annular portion when viewed from a direction perpendicular to the main surface of the resin layer. The rod-like portion may be disposed between the first metal pin and the third metal pin, and an axial direction of the rod-like portion may be substantially parallel to a winding axis of the coil.

With this structure, the coil core is located on a path through which lines of magnetic flux occurring when the inductor electrode (coil) is energized pass, and accordingly, the characteristics (for example, an inductance value) of the inductor electrode can be improved.

The other end portion of the second metal pin that has the other end face may have a flange shape. With this structure, the bond strength between the second metal pin and the circuit board can be increased.

A method of manufacturing an inductor component according to the present disclosure includes a step of preparing a first metal pin and a second metal pin that has one end face having an area larger than an area of one end face of the first metal pin and that is longer than the first metal pin, a step of connecting the one end face of the first metal pin and the one end face of the second metal pin that is longer than the first metal pin to a surface of a first metal plate that is supported by a flat frame to form a first structure in which the metal pins that have different heights are stood on the surface of the first metal plate, a step of connecting a surface of a second metal plate that is supported by a flat frame to the other end face of the first metal pin to form a second structure in which an inductor electrode that includes the first metal plate, the second metal plate, the first metal pin, and the second metal pin is formed, a step of connecting the other end face of the second metal pin to a main surface of a circuit board on which a component is mounted to form a third structure in which the component is disposed between the main surface of the circuit board and the second metal plate, a step of filling a space between the first metal plate and the main surface of the circuit board with a resin to form a fourth structure that includes the third structure and a resin layer, and a step of processing the fourth structure such that the flat frame of the first metal plate and the flat frame of the second metal plate are removed.

According to the method, since the second metal pin is longer than the first metal pin, and the area of the one end face of the second metal pin is larger than the area of the one end face of the first metal pin, the metal pins can be prevented from falling and being misaligned when the inductor component is manufactured. In addition, when the other end face of the second metal pin is connected to the main surface of the circuit board (third structure), a space in which the component is to be disposed can be formed between the second metal plate and the main surface of the circuit board, and the inductor component can be more stably manufactured. In addition, the inductor electrode that is manufactured can have a resistance value lower than resistance values of inductor electrodes formed of a conductive paste and plating respectively. Since the first metal plate and the second metal plate are supported by the flat frames, there is no need to use the main surface of the resin layer as a support plate, which is conventionally used. Accordingly, the third structure can be formed before the resin layer is formed, and the manufacturing cost of the inductor component can be decreased. In addition, there is no need for a printing process and a plating process, which are conventionally performed, to form the inductor electrode. Accordingly, the manufacturing cost of the inductor component can be further decreased, and the manufacturing time can be decreased. Since the fourth structure is processed such that the flat frame of the first metal plate and the flat frame of the second metal plate are removed, the edges of the first and second metal plates reach the periphery of the resin layer when viewed from a direction perpendicular to the main surface of the resin layer, and accordingly, the inductor component that is manufactured can have high heat dissipation.

According to the present disclosure, the inductor electrode includes the first and second metal pins and the first metal plate that each have a specific electrical resistance lower than that of a conductive paste and plating, the second metal pin is longer than the first metal pin, and the surface of the second metal pin that is in contact with the first metal plate has a large area. Accordingly, the resistance of the inductor electrode of the inductor component, which includes the resin layer and the inductor electrode, can be decreased, and the bond strength between the second metal pin and the first metal plate can be increased.

BRIEF DESCRIPTION OF THE SEVERAL VIEWS OF THE DRAWINGS

FIG. 1 illustrates an inductor component according to a first embodiment of the present disclosure.

FIGS. 2A to 2D illustrate plan views of wiring plates and a coil core in FIG. 1.

Figure 5A:
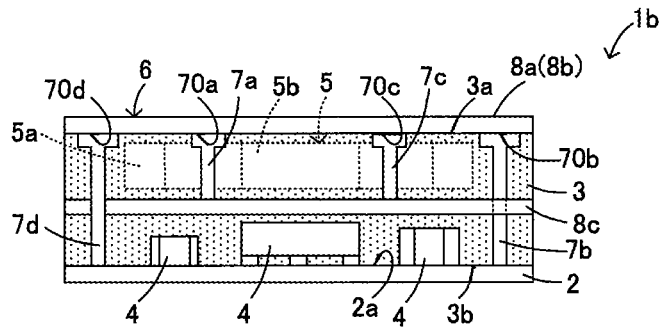
Figure 5B:
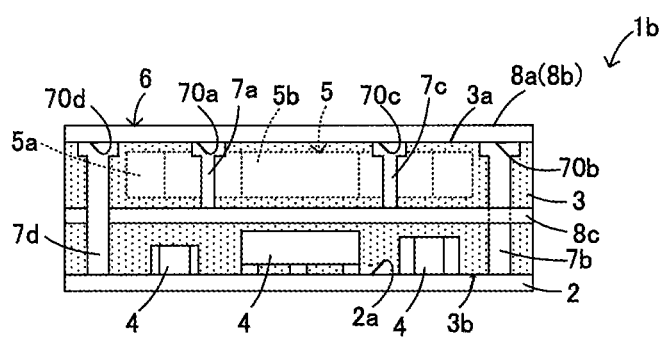
Figure 5C:
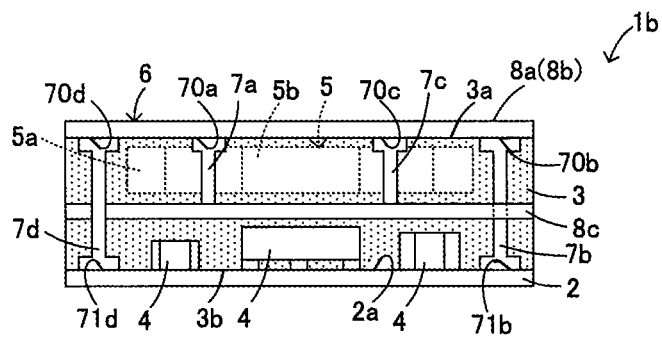

Each of FIGS. 5A to 5C illustrates an inductor component according to a second embodiment of the present disclosure.

Figure 6:
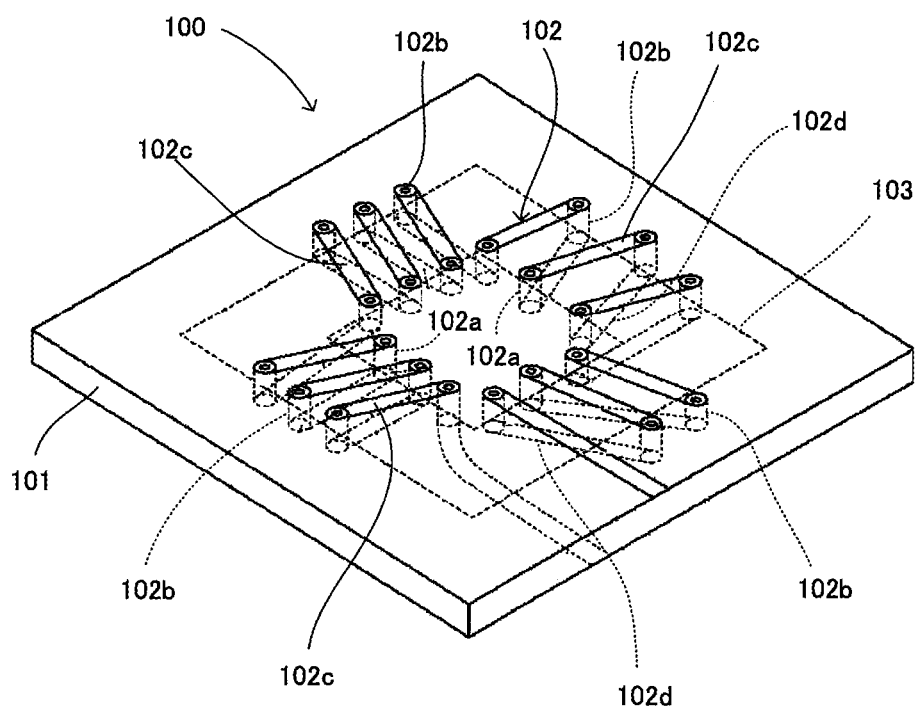

FIG. 6 is a perspective view of an existing inductor component.

DETAILED DESCRIPTION OF THE DISCLOSURE

<First Embodiment>

An inductor component according to a first embodiment of the present disclosure will be described with reference to FIG. 1 and FIGS. 2A to 2D. FIG. 1 illustrates the inductor component viewed from a direction parallel to main surfaces of a circuit board, in which a part of a resin layer is omitted to see an internal structure. FIG. 2A is a plan view of upper wiring plates. FIG. 2B is a plan view of a lower wiring plate. FIG. 2C is a plan view of a coil core. FIG. 2D is a plan view of the inductor component and illustrates a wiring structure of an inductor electrode.

(Structure of Inductor Component)

An inductor component $1a$ according to the present embodiment includes a circuit board 2, a resin layer 3 that is stacked on an upper surface $2a$ corresponding to a main surface of the circuit board 2, components 4 that are mounted on the upper surface $2a$ of the circuit board 2, a coil core 5 that is disposed in the resin layer 3, and an inductor electrode 6, and is to be mounted on, for example, a motherboard of an electronic device such as a mobile terminal device.

Examples of the circuit board 2 include a glass epoxy resin substrate and a ceramic substrate, and a via conductor and various wiring electrodes are formed therein. On the upper surface $2a$, connection electrodes (not illustrated) are formed for connection to the components 4 and metal pins $7b$ and $7d$ described later. The circuit board 2 may have a single-layer structure or a multilayer structure.

Each component 4 is composed of, for example, a semiconductor device that is formed of, for example, Si, a chip capacitor, a chip inductor, or a chip resistance.

On an upper surface $3a$ (corresponding to a "main surface of the resin layer" according to the present disclosure) of the resin layer 3, an upper wiring plate $8a$, described later, is disposed, and a lower surface $3b$ (corresponding to the "other main surface of the resin layer" according to the present disclosure) of the resin layer 3 is in contact with the upper surface $2a$ of the circuit board 2. The resin layer 3 and the circuit board 2 according to the present embodiment are oblong when viewed from a direction perpendicular to the upper surface $3a$ of the resin layer 3 (also referred to below as "a plan view"). The resin layer 3 can be formed of various materials that are typically used as sealing resins such as epoxy resins.

The coil core 5 is formed of a magnetic material for use in a typical coil core such as Mn—Zn ferrite. As illustrated in FIG. 2C, the coil core 5 according to the present embodiment has a shape obtained from a combination of an annular portion $5a$ and a rod-like portion $5b$ that is disposed such that the rod-like portion halves an inner region of the annular portion $5a$ in a plan view.

The inductor electrode 6 includes four metal pins $7a$ to $7d$ and three wiring plates $8a$ to $8c$ and serves as a coil that is wound around the rod-like portion $5b$ of the coil core 5. The metal pins $7a$ to $7d$ are classified into two types of two long metal pins and two short metal pins, and the end faces $70a$ to $70d$ thereof are exposed from the upper surface $3a$ of the resin layer 3. According to the present embodiment, as illustrated in FIG. 1, the thicknesses of the two long metal pins $7b$ and $7d$ are more than the thicknesses of the two short metal pins $7a$ and $7c$.

As illustrated in FIG. 2D, one of the two short metal pins $7a$ and $7c$ is disposed near a side of the rod-like portion $5b$ of the coil core 5, and the other is disposed near the other side of the rod-like portion $5b$. One of the two long metal pins $7b$ and $7d$ is disposed near one short side of the resin layer 3 outside the annular portion $5a$ of the coil core 5, and the other is disposed near the other short side of the resin layer 3 outside the annular portion $5a$ of the coil core 5. The two short metal pins $7a$ and $7c$ correspond to a "first metal pin" and a "third metal pin" according to the present disclosure. Each of the two long metal pins $7b$ and $7d$ corresponds to a "second metal pin" according to the present disclosure. The metal pins $7a$ to $7d$ can be formed, for example, by shearing a metal wire such as a Cu, Al, or Ag wire.

The two upper wiring plates $8a$ and $8b$ are disposed on the upper surface $3a$ of the resin layer 3. As illustrated in FIG. 2A, each of the upper wiring plates $8a$ and $8b$ has a linear shape substantially parallel to the longitudinal direction of the resin layer 3 that is oblong and connects the end faces $70a$ and $70c$ of the short metal pins $7a$ and $7c$ and the end faces $70b$ and $70d$ of the long metal pins $7b$ and $7d$ to each other. Since the thicknesses of the long metal pins $7b$ and $7d$ are more than the thicknesses of the short metal pins $7a$ and $7c$, the areas of the end faces $70b$ and $70d$, which correspond to the surfaces of the long metal pins that are connected to the upper wiring plates $8a$ and $8b$, are larger than the areas of the end faces $70a$ and $70c$, which correspond to the surfaces of the short metal pins that are connected to the upper wiring plates $8a$ and $8b$.

Specifically, each of the short metal pins $7a$ and $7c$ of the metal pins $7a$ to $7d$ is paired with a corresponding one of the long metal pins $7b$ and $7d$, and the two upper wiring plates $8a$ and $8b$ connect the end faces $70a$ to $70d$ of the metal pins $7a$ to $7d$ that are paired with each other. According to the present embodiment, each of the short metal pins $7a$ and $7c$ is paired with a corresponding one of the long metal pins $7b$ and $7d$ that is located farther from the metal pins $7a$ and $7c$. Each of the upper wiring plates $8a$ and $8b$ is formed such that both ends thereof reach the periphery (both short sides of an oblong shape in a plan view) of the resin layer 3.

The lower wiring plate $8c$ is disposed in the resin layer 3. As illustrated in FIG. 2B, the lower wiring plate $8c$ has a linear shape substantially parallel to the longitudinal direction of the resin layer 3 that is oblong and connects the other end faces of the short metal pins $7a$ and $7c$ to each other. The lower wiring plate 8c is formed such that both ends thereof reach the periphery of the resin layer 3 as in the upper wiring plates 8a and 8b, and the end portions thereof are exposed from side surfaces 3c of the resin layer 3. The other end faces of the long metal pins 7b and 7d (each corresponding to the "other end face of the second metal pin" according to the present disclosure) are exposed from the lower surface 3b (corresponding to the "other main surface of the resin layer" according to the present disclosure) of the resin layer 3 and connected to connection electrodes (not illustrated) on the upper surface 2a of the circuit board 2.

With such a connection structure, the two long metal pins 7b and 7d serve as input and output terminals, and the inductor electrode 6 is formed so as to be wound around the rod-like portion 5b of the coil core 5 (see FIG. 2D). In this case, the axial direction (length direction) of the rod-like portion 5b is substantially parallel to the winding axis of the inductor electrode 6. The two upper wiring plates 8a and 8b correspond to a "first metal plate" and a "third metal plate" according to the present disclosure. The lower wiring plate 8c corresponds to a "second metal plate" according to the present disclosure.

In the case where a planar coil pattern is formed on the upper surface 2a of the circuit board 2, the winding axis of the coil is perpendicular to the upper surface 2a of the circuit board 2. In contrast, according to the present embodiment, the wiring structure of the inductor electrode 6 is three-dimensional, and the winding axis of the coil (inductor electrode 6) is parallel to the upper surface 2a of the circuit board 2.

(Method of Manufacturing Inductor Component)

Figure 3A:
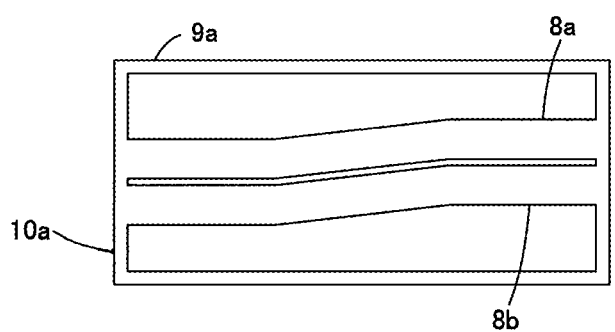
FIGS. 3A and 3B illustrate plan views of the wiring plates that are supported by frames.
Figure 3B:
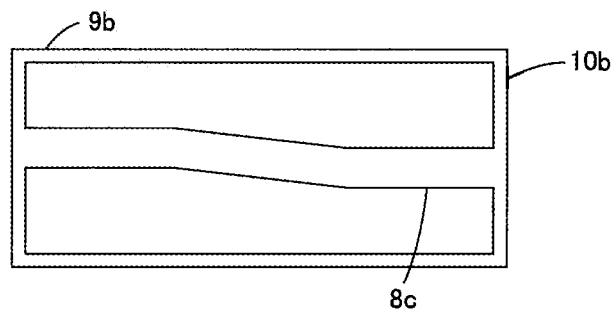

A method of manufacturing the inductor component 1a will now be described with reference to FIGS. 3A and 3B, and FIGS. 4A to 4F. FIGS. 3A and 3B illustrate plan views of the wiring plates 8a to 8c that are supported by frames. FIGS. 4A to 4F illustrates the method of manufacturing the inductor component 1a.

The wiring plates 8a to 8c are first prepared. For example, the two upper wiring plates 8a and 8b of the wiring plates 8a to 8c can be formed by etching a metal plate that is formed of, for example, Cu. At this time, regions corresponding to a frame 9a and the upper wiring plates 8a and 8b are left and the other regions are removed by etching to form a first etching plate 10a in which both ends of the upper wiring plates 8a and 8b are supported by the frame 9a. Also, in the case of the lower wiring plate 8c, a second etching plate 10b in which both ends of the lower wiring plate 8c are supported by a frame 9b is formed. The formation of the wiring plates 8a to 8c is not limited to etching. For example, various methods such as a punching process can be used.

Figure 4A:
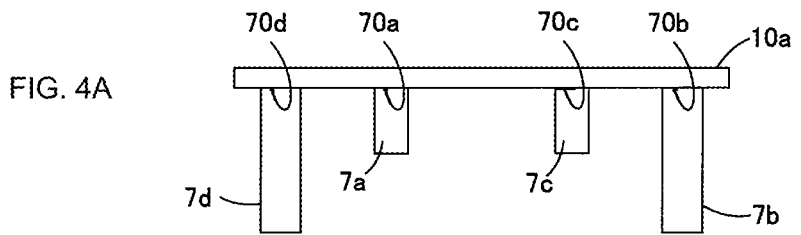
FIGS. 4A to 4F illustrate a method of manufacturing the inductor component in FIG. 1.

Subsequently, the two metal pins 7a and 7c that have substantially the same length and thickness and the two metal pins 7b and 7d that each have a length and thickness more than those of the metal pins 7a and 7c are prepared. As illustrated in FIG. 4A, each of the end faces 70a to 70d of the metal pins 7a to 7d is connected at a predetermined position to one surface of a corresponding one of the upper wiring plates 8a and 8b of the first etching plate 10a (the state in FIG. 4A corresponds to a "first structure" according to the present disclosure). Solder joining, ultrasonic joining, and a joining material such as conductive adhesive can be used for the connection.

Figure 4B:
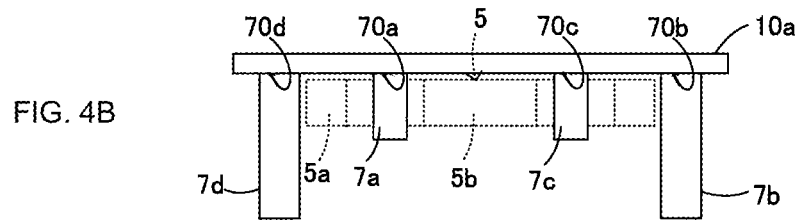

Subsequently, as illustrated in FIG. 4B, the coil core 5 is disposed on the first structure. At this time, the coil core 5 is disposed such that the rod-like portion 5b of the coil core 5 is located between the short metal pins 7a and 7c and the long metal pins 7b and 7d are located outside the annular portion 5a.

Figure 4C:
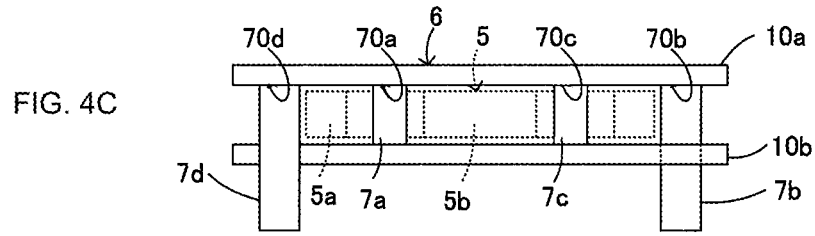

Subsequently, as illustrated in FIG. 4C, the other end faces of the short metal pins 7a and 7c are connected to one surface of the lower wiring plate 8c of the second etching plate 10b by solder joining or ultrasonic joining to form the inductor electrode 6 (the state in FIG. 4C corresponds to a "second structure" according to the present disclosure). Solder joining, ultrasonic joining, and a joining material such as conductive adhesive can be used also for the connection.

Figure 4D:
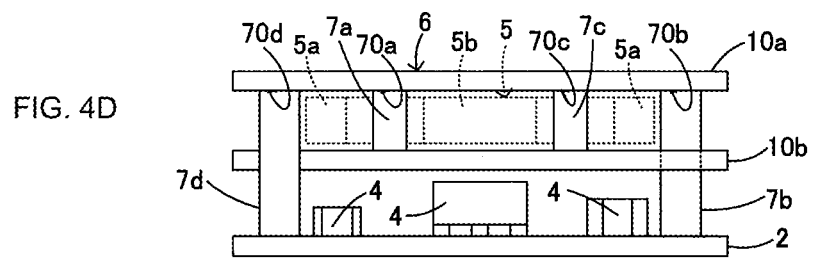

Subsequently, as illustrated in FIG. 4D, after the components 4 are mounted on the upper surface 2a of the circuit board 2 by using a known surface mount technology, the other end faces of the long metal pins 7b and 7d are connected to the upper surface 2a by using solder (the state in FIG. 4D corresponds to a "third structure" according to the present disclosure). In this case, the components 4 are located between the second etching plate 10b and the upper surface 2a of the circuit board 2.

Figure 4E:
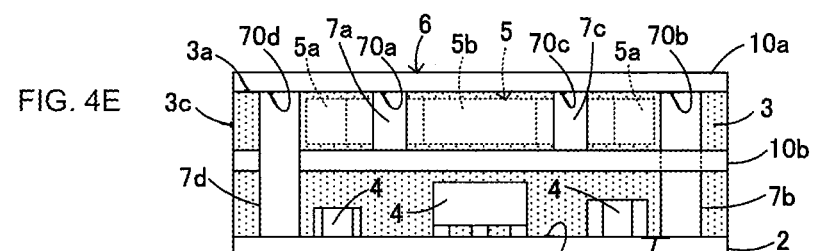

Subsequently, as illustrated in FIG. 4E, a space between the first etching plate 10a and the circuit board 2 is filled with an epoxy resin to form the resin layer 3 that seals the components 4, the coil core 5, and a part of the inductor electrode 6 (the state in FIG. 4E corresponds to a "fourth structure" according to the present disclosure). For example, a dispensing method or a printing method can be used to form the resin layer 3.

Figure 4F:
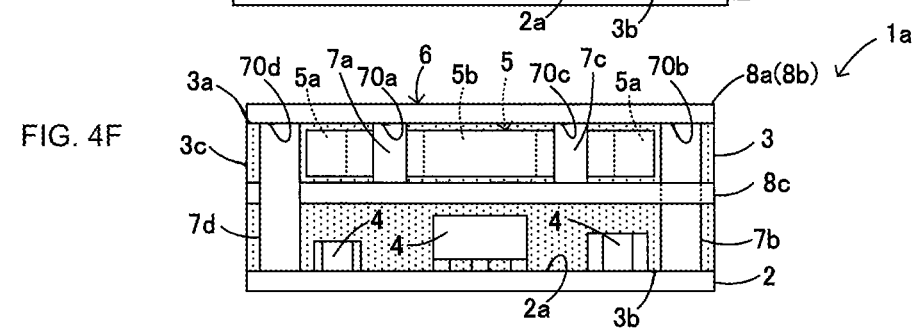

Subsequently, as illustrated in FIG. 4F, the frame 9a (see FIG. 3A) of the first etching plate 10a and the frame 9b (see FIG. 3B) of the second etching plate 10b are removed to complete the inductor component 1a. For example, a process with a dicing machine or a laser process can be used to remove the frames 9a and 9b.

According to the above embodiment, the inductor electrode 6 is formed of the metal pins 7a to 7d and the wiring plates 8a to 8c that each have a specific electrical resistance lower than that of a conductive paste and plating, and accordingly, the resistance of the entire inductor electrode 6 can be decreased. Consequently, the characteristics of the inductor component 1a (for example, the inductance value) can be improved.

The formation of the inductor electrode 6 with the metal pins 7a and 7b having different lengths enables the degree of freedom of a design of the inside of the resin layer 3 to be increased, for example, such that a region of the resin layer 3 near the upper surface 3a is used as a region in which the inductor electrode 6 is formed, and a region of the resin layer 3 near the lower surface 3b is used as a region in which the components are disposed. For example, in the case where an outer electrode is formed on a surface of the circuit board 2 opposite the upper surface 2a, and the inductor component 1a is mounted on a motherboard, the components 4 can be disposed near the motherboard, and the heat dissipation when the components 4 generate the heat can be improved.

The long metal pins 7b and 7d that have thicknesses more than the thicknesses of the short metal pins 7a and 7c enable the heat dissipation of the inductor component to be improved because metal components in the inductor component 1a increase. In addition, the second structure is more stably connected to the circuit board 2 and can be inhibited from being misaligned. Increasing the thicknesses of the long metal pins 7b and 7d increases the areas of the end faces 70b and 70d, which correspond to the surfaces to be connected to the upper wiring plates 8a and 8b, and accordingly increases the bond strength between the long metal pins 7b and 7d and the upper wiring plates 8a and 8b and between the long metal pins 7b and 7d and the circuit board 2.

The arrangement of the components 4 between the upper surface 2a of the circuit board 2 and the lower wiring plate 8c enables the size of the inductor component 1a to be decreased. For example, in the case where the coil is formed of only a wiring electrode that is formed on the upper surface 2a of the circuit board 2, it is difficult to decrease the area of the upper surface 2a of the circuit board 2. However, the formation of the inductor electrode 6 with a three-dimensional wiring structure enables the area of the upper surface 2a of the circuit board 2 to be easily decreased.

Since both ends of each of the wiring plates 8a to 8c reach the periphery of the resin layer 3, a metallic portion of the inductor component 1a can be increased unlike the case where the wiring plates 8a to 8c are each formed of only a portion that is needed to connect the end faces of the metal pins 7a to 7d to each other. Consequently, the heat dissipation of the inductor component 1a can be improved.

The difference in the potential between the long metal pins 7b and 7d that form the input and output terminals of the inductor electrode 6 increases, and there is a concern that the characteristics of the inductor electrode 6 are degraded due to a stray capacitance. According to the present embodiment, however, the metal pins 7b and 7d are disposed so as to be separated from each other, and accordingly, the stray capacitance can be reduced.

According to the present embodiment, the coil core 5 includes the annular portion 5a and the rod-like portion 5b, and the inductor electrode 6 is spirally wound along the length direction of the rod-like portion 5b. Thus, the coil core 5 is disposed on a magnetic flux path through which magnetic flux occurring when the inductor electrode 6 is energized passes, and the inductance value of the inductor electrode 6 can be effectively increased.

When the inductor component 1a according to the present embodiment is manufactured by using a pattern that is formed of a conductive paste or plating instead of the wiring plates 8a to 8c, after the components 4 are mounted on the upper surface 2a of the circuit board 2, the components 4 are sealed by a first resin layer, and a portion corresponding to the lower wiring plate 8c is formed on a surface of the first resin layer by using the conductive paste or plating. Subsequently, the coil core and the metal pins, for example, are disposed on the surface of the first resin layer and sealed by a second resin layer, and portions corresponding to the upper wiring plates 8a and 8b are formed on a surface of the second resin layer. In this case, it is necessary for the resin layers and the portions corresponding to the wiring plates to be formed by two separated processes.

According to the present embodiment, however, the inductor component 1a is manufactured by using the two etching plates 10a and 10b and the metal pins 7a and 7b having different lengths, and accordingly, the number of the formation of the resin layer 3 can be decreased to one time. Consequently, the manufacturing cost of the inductor component 1a can be decreased. In addition, there is no need for a printing process and a plating process, which are conventionally performed, and accordingly, the manufacturing cost of the inductor component 1a can be further decreased.

<Second Embodiment>

An inductor component according to a second embodiment of the present disclosure will be described with reference to FIGS. 5A to 5C. Each of FIGS. 5A to 5C illustrates the inductor component viewed from a direction parallel to the main surfaces of a circuit board, in which a part of a resin layer is omitted to see an internal structure.

As illustrated in FIGS. 5A to 5C, an inductor component 1b according to the present embodiment differs from the inductor component 1a according to the first embodiment described with reference to FIG. 1 and FIGS. 2A to 2D in that the shapes of the metal pins 7a to 7d differ. The other structures are the same as the inductor component 1a according to the first embodiment and are designated by like symbols, and a description thereof is omitted.

As illustrated in FIG. 5A, the end portions of the metal pins 7a to 7d that have the end faces 70a to 70d each have a flange shape (a longitudinal section has a T-shape), and the areas of the end faces 70b and 70d of the long metal pins 7b and 7d are larger than the areas of the end faces 70a and 70c of the short metal pins 7a and 7c.

As illustrated in FIG. 5B, the thicknesses of the portions of the long metal pins 7b and 7d other than the end portions having a flange shape may be more than the thicknesses of the portions of the short metal pins 7a and 7c other than the end portions having a flange shape.

As illustrated in FIG. 5C, the other end faces 71b and 71d of the long metal pins 7b and 7d may each have a flange shape.

According to the present embodiment, an adhesion between the long metal pins 7b and 7d, which form the input and output terminals of the inductor electrode 6, and the upper wiring plates 8a and 8b can be increased, areas in which the components are mounted on the circuit board 2 can be increased, and the degree of freedom of the design is increased. Since the end portions of the metal pins 7a to 7d that have the end faces 70a to 70d each have a flange shape, the resistance value and the temperature can be inhibited from increasing.

In the case where the areas of the end faces 70b and 70d of the long metal pins 7b and 7d are larger than the areas of the end faces 70a and 70c of the short metal pins 7a and 7c, the inductor component can be more stably manufactured. In the case where the thicknesses of the portions of the long metal pins 7b and 7d other than the end portions having a flange shape are more than the thicknesses of the portions of the short metal pins 7a and 7c other than the end portions having a flange shape, the heat dissipation of the inductor electrode 6 can be improved.

In the case where the other end faces 71b and 71d of the long metal pins 7b and 7d have a flange shape, the bond strength between the long metal pins 7b and 7d and the circuit board 2 can be increased.

The present disclosure is not limited to the above embodiments, and various modifications other than the above description can be made without departing from the spirit of the present disclosure. For example, according to the above embodiments, the inductor electrode 6 forms the coil. However, it is only necessary for the inductor electrode 6 to be used as an inductor element. There may be no coil core 5.

The number the inductor electrode 6 is wound can be appropriately changed. In this case, the number of the metal pins and the wiring plates is preferably changed in accordance with the number.

The etching plate 10a and the metal pins 7a to 7d may be joined by using a joining material that is not re-melted by reflow. Examples of the joining material include a material that can form a joint that has a melting point of about 270° C. or more and that does not contain residual Sn that has a low melting point such as copper nano paste, RADIMIX, or c-Fit.

The present disclosure can be widely used for various inductor components that each include an inductor electrode including metal pins and metal plates.

1a, 1b inductor component
2 circuit board
3 resin layer
4 component
5 coil core
5a annular portion
5b rod-like portion
6 inductor electrode
7a, 7c metal pin (first metal pin, third metal pin)
7b, 7d metal pin (second metal pin)
70a to 70b one end face of each metal pin
71b, 71d the other end face of the second metal pin
8a, 8b upper wiring plate (first metal plate, third metal plate)
8c lower metal plate (second metal plate)
9a, 9b frame (flat frame)

The invention claimed is:

1. An inductor component comprising:
   a resin layer; and
   an inductor electrode,
   wherein the inductor electrode includes
   a first metal pin and a second metal pin, wherein the first metal pin and the second metal pin extend in the resin layer, and one end face of the first metal pin and one end face of the second metal pin are exposed from a main surface of the resin layer, and
   a first metal plate disposed on the main surface of the resin layer and connecting the one end face of the first metal pin and the one end face of the second metal pin to each other,
   wherein the second metal pin is longer than the first metal pin,
   wherein an area of the one end face of the second metal pin is larger than an area of the one end face of the first metal pin, and
   wherein the inductor component further comprises:
   a circuit board having a main surface in contact with another main surface of the resin layer; and
   a component mounted on the main surface of the circuit board and sealed by the resin layer,
   wherein the inductor electrode further includes a second metal plate provided in the resin layer and connected to the other end face of the first metal pin, and
   wherein the other end face of the second metal pin is exposed from the other main surface of the resin layer and is connected to the circuit board.

2. The inductor component according to claim 1, wherein a thickness of the second metal pin is more than a thickness of the first metal pin.

3. The inductor component according to claim 1, wherein an end portion of the second metal pin having the one end face has a flange shape.

4. The inductor component according to claim 1, wherein the inductor electrode further includes
   a third metal pin being shorter than the second metal pin and extending in the resin layer, wherein one end face of the third metal pin is exposed from the main surface of the resin layer, and
   a third metal plate disposed on the main surface of the resin layer and connected to the one end face of the third metal pin,
   wherein the second metal plate connects the other end face of the first metal pin and the other end face of the third metal pin to each other such that the inductor electrode provides a coil that has a winding axis that is substantially parallel to the main surface of the resin layer.

5. The inductor component according to claim 1, wherein a part of an edge of the first metal plate, or a part of an edge of the second metal plate, or the parts of the edges of the first metal plate and the second metal plate reach a periphery of the resin layer when viewed from a direction perpendicular to the main surface of the resin layer.

6. The inductor component according to claim 4 comprising: a coil core disposed between the first metal pin and the third metal pin and between the first metal plate and the second metal plate.

7. The inductor component according to claim 6, wherein the coil core has a shape obtained from a combination of an annular portion and a rod portion that is disposed such that the rod portion halves an inner region of the annular portion when viewed from a direction perpendicular to the main surface of the resin layer, and
   wherein the rod portion is disposed between the first metal pin and the third metal pin, and an axial direction of the rod portion is substantially parallel to a winding axis of the coil.

8. The inductor component according to claim 1, wherein another end portion of the second metal pin having the other end face has a flange shape.

9. A method of manufacturing the inductor component according to claim 1, the method comprising:
   a step of preparing a first metal pin and a second metal pin, wherein the second metal pin has one end face having an area larger than an area of one end face of the first metal pin and is longer than the first metal pin;
   a step of connecting the one end face of the first metal pin and the one end face of the second metal pin to a surface of a first metal plate supported by a flat frame to form a first structure, wherein in the first structure, the metal pins having different heights are stood on the surface of the first metal plate;
   a step of connecting a surface of a second metal plate supported by a flat frame to the other end face of the first metal pin to form a second structure, wherein in the second structure, an inductor electrode including the first metal plate, the second metal plate, the first metal pin, and the second metal pin is formed;
   a step of connecting the other end face of the second metal pin to a main surface of a circuit board having a component mounted to form a third structure, wherein in the third structure, the component is disposed between the main surface of the circuit board and the second metal plate;
   a step of filling a space between the first metal plate and the main surface of the circuit board with a resin to form a fourth structure including the third structure and a resin layer; and
   a step of processing the fourth structure such that the flat frame of the first metal plate and the flat frame of the second metal plate are removed.

10. The inductor component according to claim 2, wherein an end portion of the second metal pin having the one end face has a flange shape.

11. The inductor component according to claim 4, wherein a part of an edge of the first metal plate, or a part of an edge of the second metal plate, or the parts of the edges of the first metal plate and the second metal plate reach a periphery of the resin layer when viewed from a direction perpendicular to the main surface of the resin layer.

12. The inductor component according to claim 5 comprising: a coil core disposed between the first metal pin and the third metal pin and between the first metal plate and the second metal plate.

* * * * *